United States Patent [19]

Wieder

[11] 4,350,993
[45] Sep. 21, 1982

[54] HETEROJUNCTION AND SCHOTTKY BARRIER EBS TARGETS

[75] Inventor: Herman H. Wieder, San Diego, Calif.

[73] Assignee: The United States of America as represented by the Secretary of the Navy, Washington, D.C.

[21] Appl. No.: 160,034

[22] Filed: Jun. 16, 1980

[51] Int. Cl.$^3$ ............................................. H01L 27/14
[52] U.S. Cl. ........................................ 357/29; 357/15; 357/22
[58] Field of Search ....................... 357/15, 29, 65, 22

[56] References Cited

U.S. PATENT DOCUMENTS

| | | | |
|---|---|---|---|
| 3,736,571 | 5/1973 | Cohen et al. | 365/114 |
| 4,032,947 | 6/1977 | Kesel et al. | 357/24 |
| 4,047,199 | 9/1977 | Kataoka et al. | 357/3 |
| 4,163,984 | 8/1979 | Pucel | 357/220 R |
| 4,282,043 | 8/1981 | Chang | 357/65 X |

OTHER PUBLICATIONS

B. W. Bell and R. I. Knight, "An EBS L-Band Amplifier" in: *International Electron Devices Meeting, Technical Digest*, Washington, D.C. Dec. (1976) pp. 659-661.

Primary Examiner—Martin H. Edlow
Assistant Examiner—J. Carroll
Attorney, Agent, or Firm—Robert F. Beers; Ervin F. Johnston; Thomas Glenn Keough

[57] ABSTRACT

A metal semiconductor field effect transistor (MESFET) has a Schottky barrier gate formed by depositing an electron transparent electrode to allow its modulation by electric fields and electron beams. The electrode is coupled to an electric field source which is maintained constant or is varied for changing the current flow between the source electrode and drain electrode. An impinging modulating electron beam is directed through the transparent gate to further modulate the current flow between the source electrode and drain electrode and to effect an overall gain in the neighborhood of $10^6$. The accelerating potential of the electron beams is of at least an order of magnitude less than conventional cathode ray tube potentials to reduce the possibility of damage to the MESFET material and, since a number of the MESFETS can be modulated by one or more electron beams, they have wide frequency selectivities, broad bandwidths and high switching time capabilities. In addition to an apparatus, a method of improving the modulation of an emerging family of MESFETS first calls for the impressing of an electric field on an electron transparent gate electrode to change the current flow between the source electrode and the drain electrode. This electric field can be a constant value so that a subsequent directing of modulating electrons through the electron transparent gate electrode and into the semiconductor further modulates the current flow between the source electrode and the drain electrode to provide for increased operational capabilities.

20 Claims, 4 Drawing Figures

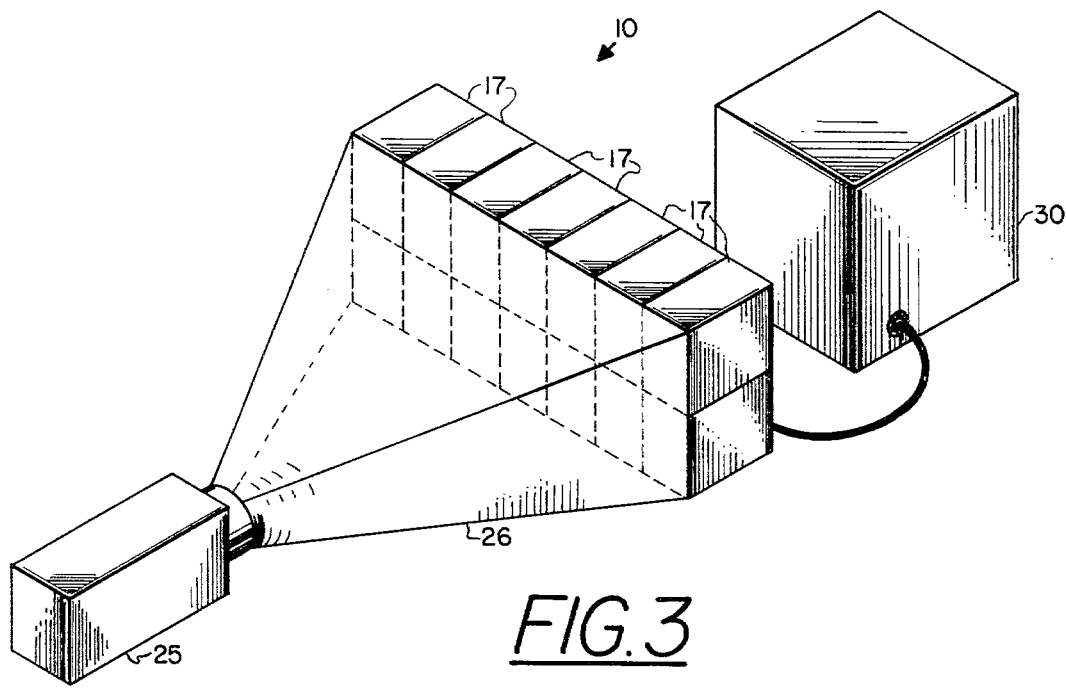
FIG.3
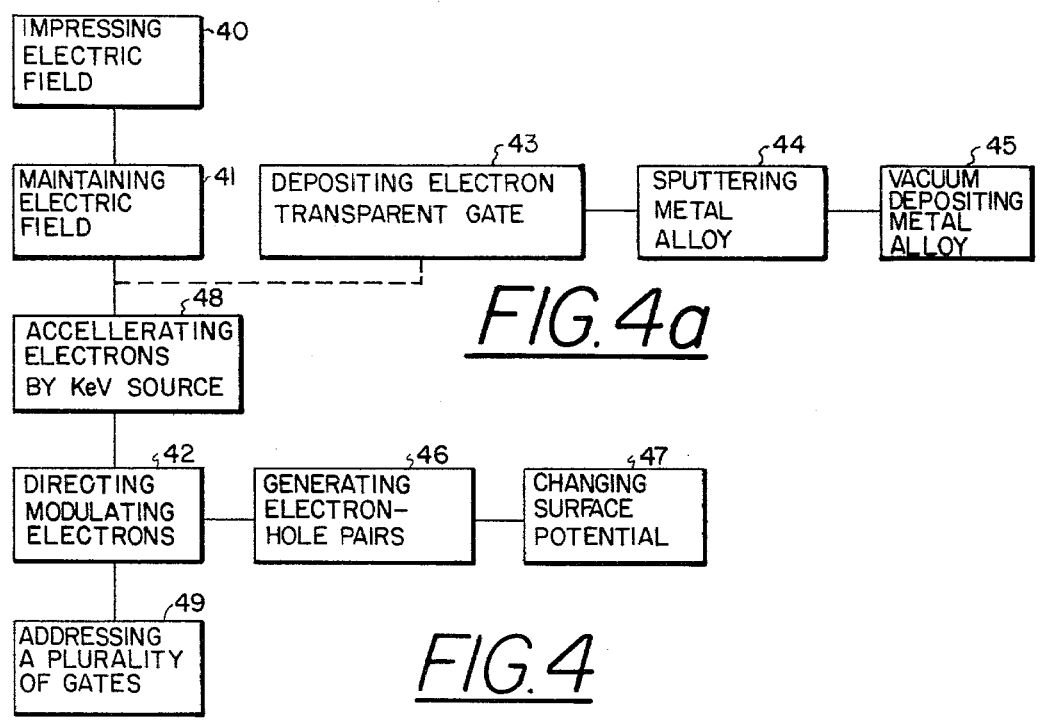
FIG.4a
FIG.4

HETEROJUNCTION AND SCHOTTKY BARRIER EBS TARGETS

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

Electron bombarded semiconductor devices are receiving more attention for power amplification and control. The electron bombarded semiconductor devices perform beyond some existing devices and offer exciting new possibilities due to their unique capabilities. For example, they lend themselves for broad-band frequency or time domain amplifiers, pulse modulators, harmonic generators, real-time samplers, signal processers and a host of other applications including multi-function performance from a single device.

Simply stated, the relevant theory calls for an electron bombarded semiconductor actuated by an electron beam that effects control by injecting carriers into a back-biased semiconductor diode. A modulated electron beam incident on a reverse-biased semiconductor p-n junction is used to modulate the density of charge carriers and, therefore, the current flowing through the junction. The effect is similar to the modulation produced by a photon beam on a semiconductor; modulation of the photon beam produces, by means of the photoelectric effect, a modulation of the charge carrier density in the semiconductor. Electron beams with beam energies of approximately 10 keV can be used to produce a substantial current gain of the order of more than $10^3$ in semiconductor p-n junctions. This is the basis of the hybrid electron beam semiconductor technology. Typical electron beam semiconductor structures consist of an electron-beam source, a high frequency modulation scheme of the electron beam and a p-n junction target all enclosed in a high-vacuum envelope. The modulation is produced by a small potential applied to a grid which controls the electron beam current or a deflection system which moves the electron beam from one diode to another when there are a multitude of diodes arranged in a diode matrix array. So far, the electron bombarded semiconductor device technology has concerned itself primarily with having a silicon p-n junction as the appropriate target.

A most helpful acquaintance with this technology appears in Volume 62, No. 8, August 1974 of the Proceedings of the IEEE in an article entitled "ELECTRON BOMBARDED SEMICONDUCTOR DEVICES" by Aris Silizars, David J. Bates and Aaron Ballonoff. This paper familiarizes a reader with how the devices work and their actual and potential uses. A semiconductor diode is used as a target in a vacuum tube and, when electron beams having an energy between 10 and 15 keV strike the p-n junctions, multiple hole-electron pairs are created by each incident high energy electron. It has been found that a hole-electron pair is created by approximately every 3.6 eV of energy expended, so that each 12 keV incident beam electron can produce thousands of carrier pairs in the diode to result in a current amplification or gain in the neighborhood of 2000 or more. The injection of carriers into a typical diode is accomplished by bombarding the top metal contact with the energized electron beam. Even though the electrons in the beam lose some energy penetrating both the top metal contact layers and a highly doped thin junction region, they enter the depletion region with considerable energy. The energy remaining after penetrating the loss layers is dissipated in the process of forming electron-hole pairs near the junction. One polarity of the carrier moves through the depletion region of the semiconductor causing the current to flow in the load circuit while the other polarity carrier is swept back to the bombarded contact to provide current continuity in the diode circuit.

An electron bombarded semiconductor amplifier employing a GaAs Schottky barrier instead of a p-n junction has been discovered to have power gain up to 1 GHz. This gain includes 50 watts peak pulse power at 150 MHz and 5 watts at 1 GHz, a power gain of 1.3 dB at 1 GHz and efficiency of 17 percent using beam energies of 8 to 20 keV. In contrast with the diode target degradation under electron beam bombardment in silicon p-n junction devices, there has been no such degradation in GaAs Schottky barrier diodes. GaAs devices have other advantages over silicon electron bombarded semiconductor devices because the unsaturated electron velocity of GaAs is larger than that of silicon and the electron transient time of GaAs is shorter than that of silicon. In addition, the GaAs materials appear to be less susceptible to electron beam degradation than silicon although the exact reasons for these phenomena are not clearly understood.

On the other hand, electron bombarded semiconductor devices fabricated with GaAs can not handle the power levels that the silicon devices can largely because the thermal conductivity of GaAs is only about 60 percent that of silicon. Another limitation of using GaAs is that it has a chemical reactivity inherent in the use of metal Schottky barriers on GaAs. The metal-GaAs metallurgical interreactions cause both short term and long term degradation of Schottky barriers and might well be expected to cause similar problems in electron bombarded semiconductor applications. Irrespective of the limitations of the GaAs semiconductor material, it has been repeatedly demonstrated that, overall, the current gain and frequency response of the GaAs Schottky barriers in electron bombarded semiconductor applications are superior to those of silicon p-n junction. The lower gain of p-n junctions are attributed to recombination losses in the p-layers. Current gains are approximately 1500 for silicon, GaAs and $GaAs_xP_{1-x}$ Schottky barriers and it was confirmed that GaAs is less susceptible to deterioration than silicon and there were no specific advantages of using $GaAs_xP_{1-x}$ for electron bombarded semiconductor purposes.

Thus, there is a continuing need in the state of the art for an electron bombarded semiconductor device capable of being excited by electrons which does not damage the semiconductor material, has the capability for large relative current gains and which lends itself to microwave, digital and analog signal processing requirements and for wideband travelling wave tube applications.

SUMMARY OF THE INVENTION

The present invention is directed to providing an apparatus and method for modulating the current flow between a source electrode and a drain electrode in a semiconductor. A gate electrode is mounted on the semiconductor and is coupled to an electric field source for changing the current flow between the source electrode and the drain electrode by the electric field. The gate electrode is dimensioned and fabricated from a material having the property of being substantially transparent to the passage of electrons. A means is disposed adjacent the gate electrode for directing modulating electrons through the electrode and into the semiconductor to assure the further modulation of the current flow between the source electrode and the drain electrode in response to the electron beam. The modulating method of the invention includes the impressing of an electric field on an electron transparent gate electrode mounted on a semiconductor to change the current flow between a source electrode and a drain electrode by the electric field and directing modulating electrons through the electron transparent electrode and into the semiconductor to further modulate the current flow between the source electrode and the drain electrode. The step of impressing the electric field optionally includes the maintaining of a given electric field to enable a more responsive modulation by the modulating electron beam. The step of directing of the modulating electrons optionally creates the generation of electron-hole pairs in the space charge region under the electron transparent gate electrode. Further responsive operation is assured by having a controlled depositing of the electron transparent gate electrode to a predetermined thickness.

Therefore, it is a prime object of the invention to provide an improved electron bombarded semiconductor device.

A concomitant prime object is to provide a method by which a semiconductor is modulated by an electron beam and an electric field.

Another object is to provide an electron bombarded semiconductor employing lower energy impacting electrons to avoid damage to the semiconductor material.

Yet another object of the invention is to provide a modulation improvement employing electron beams bombarding Schottky barrier targets.

Yet another object is to provide an apparatus and method synergistically combining electron beam and MESFET technologies.

Still another object of the invention is to provide an electron beam modulation apparatus and scheme that relies upon the impact ionization in the space-charge region for responsive modulation of the current flow in MESFETs.

Another object of the invention is to provide electron beam excitation for a MESFET to modulate the current flow in the transistor at the rate density proportional to the modulation of the incident beam.

Still another object is to provide an electron bombarded semiconductor having current gains in the order of $10^5$ to $10^6$ relative to the magnitude of the incident modulating electron beam.

Yet another object is to provide a Schottky barrier field effect transistor capable of microwave gain at the 1 watt power level by an incident electron beam of approximately 1 nanoamp.

Another object is to provide a Schottky barrier gate field effect transistor having a gate in the order of a 600 angstrom thickness which is substantially transparent to incident electrons.

Still another object is to provide a MESFET relying on a change of surface potential produced by induced electron-hole pairs caused by an impacting electron beam.

Still another object is to provide an electron bombarded semiconductor transistor assembly capable of microwave response and microwave power gain limited by the minority carrier lifetime.

Another object is to provide a method and apparatus for addressing a multiplicity of transistors by at least one electron beam to optionally, simultaneously or sequentially, achieve high power output, microwave response, high frequency multiplexing and the like.

Another object is to provide a scheme for modulating a number of transistors by at least one electron beam to assure phase delays between sequentially addressed transistors to provide for wide bandwidth response.

Yet another object is to provide an electron beam addressing scheme which provides a traveling wave structure that is related to a traveling wave moving along the structure.

Another object is to provide an electron beam modulating apparatus and method that algebraically takes advantage of the generation of electron hole-pairs and a transistor's inherent gain to achieve overall higher amplification at lower accelerating potentials and modulating electron beam densities.

Another object is to provide a Schottky barrier field effect transistor modulated by an impinging electron beam giving a current gain produced by a combination of charge multiplication in the space-charge region under the gate electrode and the inherent gain of the transistor itself.

Yet another object is to provide an electron beam modulated semiconductor using a lower accelerating potential as compared to contemporary devices.

These and other objects of the present invention will become more readily apparent from the ensuing specification and claims when considered with the appended drawings.

BRIEF DESCRIPTION OF THE DRAWINGS

FIG. 3 depicts a matrix-like array for assuring increased frequency capabilities, reaction time, multiplexing techniques, etc., by at least one modulating electron beam.

FIG. 4 is a block diagram representation of the modulation scheme of this invention.

FIG. 4a is a block diagram of a novel feature of this inventive concept.

DESCRIPTION OF THE PREFERRED EMBODIMENTS

Figure 1:
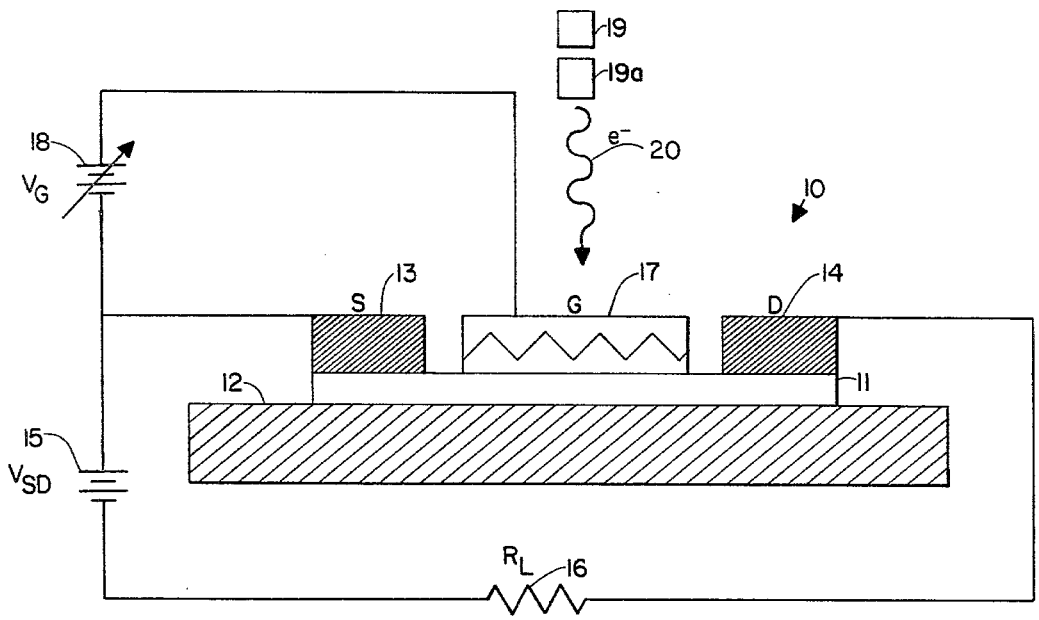
FIG. 1 is a schematic representation of a representative embodiment of the invention.

Referring now to the drawings and in particular to FIG. 1, a current flow modulator 10 generally assumes the configuration commonly of a field effect transistor. Experience has demonstrated that a metal semiconductor field effect transistor (MESFET) possesses superior operating capabilities as compared to a metal oxide semiconductor field effect transistor (MOSFET). Because of the tendency for MOSFETs to trap electrons in the insulation region, the frequency response is not as desirable as is possible with a MESFET. MESFETs also tend to have high gains, high power amplification efficiencies, good possibilities of miniaturization to submicron dimensions, and good chances for monolithic integration of circuits on semi-insulating substrates to lower parasitic capacitances, low loss interconnections and high packing density. In addition, properly constructed MESFETs can have gates that can be made much more transparent to electrons as compared to some MOSFETs. The selection of the electron transparent materials will be discussed below.

A current carrying layer 11 is an epitaxial layer on a semi-insulating substrate 12. The epitaxial layer is usually in the neighborhood of about one quarter micron thick and is selected from a number of available n-type materials. Typical materials are InP, $InAs_xP_{1-x}$, $In_xGa_{1-x}As_yP_{1-y}$, GaAs etc. although other not named binary, ternary and quaternary alloys could function satisfactorily. The pros and cons of the various materials have been widely discussed in the art. Each has its own merits and may be optionally selected to achieve the desired ends.

Two ohmic contacts are made on epitaxial layer 11, those being a source electrode 13 and a drain electrode 14. The contacts are fabricated according to known, accepted procedures to assure that a current will flow between the electrodes when the proper magnitude of a positive voltage $V_D$, 15, is applied across them and an interconnected load 16.

A metal to semiconductor gate electrode 17 is deposited on the surface of epitaxial layer 11 between the source and drain electrodes. The electrode is connected to a gate potential source 18, otherwise referred to as $V_G$, to produce an electric field emanating from the electrode. This electric field creates a region in the epitaxial layer that is depleted of free electrons. The depletion region acts like an insulating region and constricts the cross section available for current flow between the source and drain electrodes. Varying the width of the depletion region is dependent on varying the gate voltage source and its electric field projected by the gate electrode. If within designed constraints, the gate potential is selectively varied within a predetermined range, then the current between the source and drain will be responsively varied or modulated. Looking at this phenomenon from a different standpoint, the resistance between the source and drain is larger or smaller depending on the magnitude and polarity of gate potential 18.

In other words, the current between the drain and source is a function of the width of the depletion layer beneath the gate electrode. Heretofore such modulation of the current flow between the drain and source has been accomplished by an electric field being impressed by the gate electrode. This theory and mode of operation is thoroughly discussed and well presented in an article entitled, "Microwave Field-Effect Transistor'-'—1976 by Charles A. Liechti in the June 1976 issue of *Transactions on Microwave Theory and Techniques*, Vol. MTT-24, No. 6.

Further modulation capabilities using MESFETS are attainable by the teachings of this inventive concept. A source and modulator of electrons 19 emits electrons 20 which optionally may be made to pass through a deflection circuit 19a. The electrons are accelerated by energies of about 1 KeV from the source and modulated in accordance with widely adapted practices. Electromagnetic deflection circuits, for example, directs a beam of modulated electrons 20 in much the same manner as has been done routinely in the art. The MESFET, electron source and deflection circuit can all or partially be contained by an envelope in a vacuum or gas if desired.

The flow of electrons impinges on gate electrode 17. The electrode has been specifically designed and fabricated from a material essentially transparent to electrons so that they freely go through the gate and penetrate the epitaxial layer.

The relatively unimpeded transmission of electrons through the gate is owed to the proper selection of the gate material. A chromium-gold alloy or a nickel-gold alloy is deposited on the epitaxial layer by well known sputtering or vacuum-depositing techniques to a thickness of about 600 angstroms. This thickness has been found to be an acceptable compromise between the gate's requirements for conductance of the electric field supplied by gate potential source 18 and for transparency to the impinging electrons 20 coming from source 19. Certainly, it is envisioned that for some operational requirements, the gate electrode's thickness may be changed to perform as intended.

Figure 2:
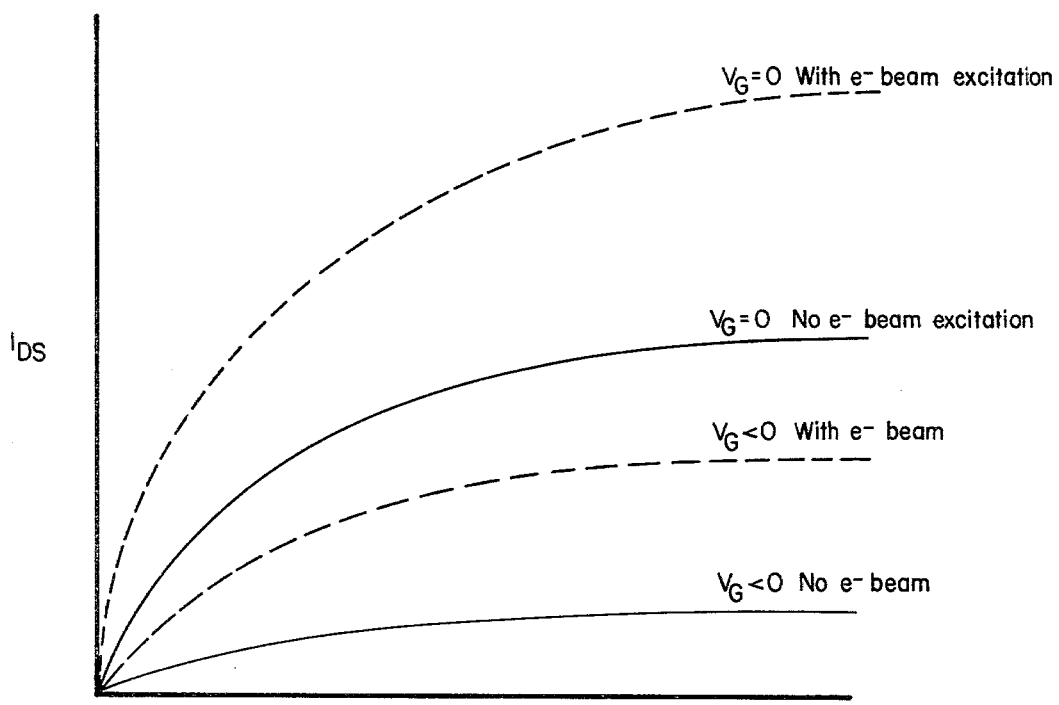
FIG. 2 depicts certain operative characteristics typical of an electron bombarded semiconductor device fabricated and modulated in accordance with the disclosed inventive concept.

For a given density of impinging electrons accelerated by a given potential electron volt driving force, representative operational characteristics will be generated, note FIG. 2. Increasing the electron density or decreasing the electron density as well as increasing the accelerating potential will effect changes in the modulation of the current between the drain and source electrodes. This phenomenon is caused by the charge multiplication in the space charge region under the gate and the generation of induced electron-hole pairs in the epitaxial layer 11. Referring once again to FIG. 2 where $V_G=0$ and $e^-$ beam increases the current $I_{DS}$. Having $V_G<0$ (reversed biased) and an impinging $e^-$ beam lowers the maximum current yet provides for responsive electron beam modulation within a discrete range.

An accelerating potential of 1 keV or less is all that is needed to initiate generation of the electron-hole pairs. It has been shown that for about every four electron volt acceleration potential (closer to 3.6 eV) one hole-electron pair is created so that when an electron is accelerated by approximately 1 keV, about 250 electron-hole pairs are created in the Schottky barrier gate region of typical MESFET'S. This corresponds to an effective current gain of 250 for each incident high energy electron an additional 250 electrons are thus produced. Typical MESFET have inherent gains of the order of $10^3$. The total gain of an electron beam excited MESFET is thus the product of the charge multiplication and the inherent gain: $250 \times 10^3 = 2.5 \times 10^5$ or more.

The lower acceleration potentials, in the 1 keV range, avoid the possibility of damaging the semiconductor material of the epitaxial layer. The harmful TV tube or X-ray source accelerating potentials, in the 10 keV range, are not needed. Thus the device of this inventive concept not only assures more reliable, long life but also reduces the hazard to attendant personnel.

The use of a modulating beam of electrons allows designers to take advantage of the inherent superior operating characteristics of MESFET'S. MESFET'S are capable of microwave operation at GHz rates due to their inherent material properties, dimensions and modes of fabrication which lead to short electron transit time between source and drain. The electron beam gives designers the capability of fully realizing the potentials of MESFET'S by allowing them to rapidly switch modulating beams from one unit to another. Looking to FIG. 3, a matrix of MESFET'S 10 have their gates 17 facing a modulated deflectible source 25 of at least one modulating electron beams. Optionally, the whole works is contained in a vacuum envelope 26.

Rapid switching and scanning of the MESFET matrix is in accordance with well known means so that an interconnected switching circuit 30 need only deliver composite command signals that embrace much greater bandwidths, higher switching times more complex frequency and time multiplexed information or a highly selective, rapid composite signal pattern. As a further alternative embraced by this inventive concept, the number of gates 17 can be individually connected to discrete frequency responsive or frequency generating circuits to allow the selective generation of composite signals. As mentioned above, the faster time and frequency multiplexed density and the acceleration of the electron beam both are variable. When gate potential 18 is set, so that the electric field is uniform, there is only one variable source, the electron beam source, which modulates the current between the drain and source. It is fully within the capabilities of this inventive concept to call for a modulation scheme fixing the magnitude of the electron beam while the gate voltage is varied to control the drain-source current, or, both can be variable simultaneously either on a time or frequency basis or a combination of the two.

It is also fully within the capabilities of the MESFET'S, having an electron transparent gate as herein disclosed, to be targeted by source 25 projecting several modulating electron beams. Furthermore, several such sources can be spaced at a number of positions relative to the exposed electron transparent gates of the MESFET matrix. It is apparent that the flexibility afforded by having the modified MESFET'S modulatable by electron beam source is limited only by a designer's imagination. The full potential and capabilties of an array of MESFET'S are realizable and traveling wave arrangements could be fabricated by simply arranging a multitude of MESFET'S in a predetermined configuration and scanning them with appropriately phased electron beams from one or more sources.

Looking to FIG. 4 a block diagrammatical representation sets forth the method of the invention. First, there is an impressing 40 of an electric field across the epitaxial layer in a MESFET to create a depletion region therein. This impressing of the electric field can be variable and to represent the modulating influence of an information source or it can be a maintaining 41 of the electric field at a predetermined magnitude so as to bias the limits of the current flow through the epitaxial layer. A directing 42 of modulating electrons at the gate of the MESFET gives a designer the option for further modulating a current flow through the epitaxial layer. Such further modulation is assured since the gate is so disposed by the depositing 43 of an electron transparent gate on the epitaxial layer.

The gate is so located by a conventional sputtering 44 of the metal alloy or a vacuum depositing 45 of the metal alloy to a predetermined thickness which is predetermined to balance the requirements of producing an electric field from a gate potential source and being transparent to the impinging electron beam. After the beam goes through the gate and penetrates the space charge region beneath it, there is the generating 46 and impact ionizing 47 of electron-hole pairs within the depletion region so that the gain of the electron beam modulated MESFET is the product of the charge multiplication and the gain of the transistor. The charge multiplication of electron-hole pairs is caused by the previous accelerating 48 of the electrons by a potential source of one keV even before the step of directing the electrons.

The capability for multiplexing if assured by a matrix of electron transparent gates exposed to at least one modulating electron beam which effects the addressing 49 of a plurality of gates. The sequential, selective or other preprogrammed addressing allows the generation of composite signal waveforms, the use of which is limited only by the designer's imagination.

Obviously, many other modifications and variations of the present invention are possible in the light of the above teachings. It is therefore to be understood that within the scope of the appended claims the invention may be practiced otherwise than as specifically described.

What is claimed is:

1. In an apparatus for modulating the current flow between a source electrode and a drain electrode in a metal field effect transistor at rates up to and including microwave frequencies, an improvement therefor is provided; comprising:

an electron transparent gate mounted on the metal field effect transistor and coupled to an electric field source for changing the current flow between the source electrode and drain electrode by the electric field, the electron transparent gate is dimensioned and fabricated from a material having the property of being substantially transparent to the passage of electrons and means disposed adjacent the electron transparent gate for directing modulating electrons therethrough and into the metal field effect transistor to further modulate the current flow between the source electrode and drain electrode in response to the electron beam at said rates up to and including microwave frequencies.

2. An improved apparatus according to claim 1 in which the electron transparent gate includes a sputtered or vacuum deposited chromium-gold alloy layer approximately six hundred angstroms thick affording an acceptable compromise between conductance of the electric field and transparency to the modulating electrons.

3. An improved apparatus according to claim 1 in which the electron transparent gate includes a sputtered or vacuum deposited nickel-gold alloy layer approximately six hundred angstroms thick affording an acceptable compromise between conductance of the electric field and transparency to the modulating electrons.

4. An improved apparatus according to claim 1 in which the further modulation of the current flow is by the generation of electron-hole pairs in the order of one thousand to one in the space charge region under the electron transparent gate.

5. An improved apparatus according to claim 1 in which the further modulation of the current flow includes charge multiplication in the order of one thousand to one in the space charge region under the electron transparent gate.

6. An improved apparatus according to claim 1 in which the modulating electron directing means includes an accelerating potential source having a magnitude of about one kilovolt.

7. A method of modulating the current flow between a source electrode and a drain electrode in a metal field effect transistor at rates up to and including microwave frequencies comprising:

impressing an electric field on an electron transparent gate electrode mounted on the metal field effect transistor to change the current flow between the source electrode and the drain electrode by the electric field and directing modulating electrons through the electron transparent gate electrode and into the metal field effect transistor to further modulate the current flow between the source electrode and the drain electrode at said rates up to and including microwave frequencies.

8. A method according to claim 7 in which the step of impressing an electric field includes maintaining a given electric field to enable a responsive directing of the modulating electrons.

9. A method according to claim 7 further including: an electron transparent gate electrode of about six hundred angstroms thick to provide an acceptable compromise between the conductance of the electric field and the transparency to the modulating electrodes.

10. A method according to claim 9 in which the electron transparent gate electrode includes the deposited metal alloy such as chromium-gold or nickel-gold on the semiconductor.

11. A method according to claim 9 in which the electron transparent gate electrode includes the vacuum deposited metal alloy such as chromium-gold or nickel-gold on the semiconductor.

12. A method according to claim 7 in which the step of directing modulating electrons includes the generating of electron-hole pairs in the space charge region under the electron transparent gate.

13. A method according to claim 7 in which the step of directing modulating electrons includes the impact ionizing in the ratio of one to ten in the space charge region under the electron transparent gate.

14. A method according to claim 7 in which the step of directing modulating electrons includes the step of accelerating the electrons by a one kilovolt potential source.

15. A method according to claim 13 in which the step of directing modulating electrons includes the step of accelerating the electrons by a one kilovolt potential source.

16. A method according to claim 15 in which four eV create an electron hole pair.

17. A method according to claim 7 in which the modulation by the steps of impressing an electric field and directing modulating electrons is optionally at a microwave rate.

18. A method according to claim 7 in which the modulation of the step of directing modulating electrons is at a microwave rate.

19. A method according to claim 7 in which the step of directing modulating electrons includes the addressing of a plurality of electron transparent gate electrodes to provide for broadband response.

20. A method according to claim 7 in which the step of directing modulating electrons includes a sequential addressing of a plurality of electron transparent gate electrodes to provide extending frequency, bandwidth, and time sharing capabilities.

* * * * *